(12) United States Patent
Lin et al.

(10) Patent No.: US 12,107,415 B2
(45) Date of Patent: Oct. 1, 2024

(54) ELECTROSTATIC DISCHARGE PROTECTION CIRCUIT AND ELECTRONIC CIRCUIT

(71) Applicant: Vanguard International Semiconductor Corporation, Hsinchu (TW)

(72) Inventors: Chih-Hsuan Lin, Hsinchu (TW); Shao-Chang Huang, Hsinchu (TW); Wen-Hsin Lin, Zhubei (TW); Yeh-Ning Jou, Hsinchu (TW); Hwa-Chyi Chiou, Hsinchu (TW); Chun-Chih Chen, New Taipei (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 180 days.

(21) Appl. No.: 17/989,134

(22) Filed: Nov. 17, 2022

(65) Prior Publication Data
US 2024/0170953 A1 May 23, 2024

(51) Int. Cl.
*H02H 9/02* (2006.01)
(52) U.S. Cl.
CPC ..................................... *H02H 9/02* (2013.01)
(58) Field of Classification Search
CPC .. H02H 9/02; H02H 9/04; H02H 9/00; H02H 9/005; H02H 9/046; H02H 3/20; H02H 9/041; H02H 9/043; H01L 27/0248; H01L 27/0251

USPC .......................................................... 361/56
See application file for complete search history.

(56) References Cited

U.S. PATENT DOCUMENTS 6,128,171 A * 10/2000 Iniewski ................. H01L 24/05
361/111
2008/0158748 A1* 7/2008 Kemper .............. H01L 27/0266
361/57

* cited by examiner

*Primary Examiner* — Danny Nguyen
(74) *Attorney, Agent, or Firm* — Birch, Stewart, Kolasch & Birch, LLP

(57) ABSTRACT

An electrostatic discharge protection circuit is provided. The electrostatic discharge protection circuit includes first, second, and third transistors and a discharge circuit. The first transistor has a first gate, a first drain coupled to the bonding pad, and a first source coupled to a first node. The second transistor has a second gate coupled to a power terminal, a second drain coupled to the first gate, and a second source coupled to a ground. The third transistor has a third gate coupled to the power terminal, a third drain coupled to the first node, and a third source coupled to the ground. The discharge circuit is controlled by a driving voltage at the first node. In response to an electrostatic discharge event occurring on the bonding pad, the discharge circuit provides a discharge path between the bonding pad and the ground according to the driving voltage.

20 Claims, 9 Drawing Sheets

ELECTROSTATIC DISCHARGE PROTECTION CIRCUIT AND ELECTRONIC CIRCUIT

BACKGROUND OF THE INVENTION

Field of the Invention

The present invention relates to an electronic circuit, and more particularly, to an electrostatic discharge protection circuit.

Description of the Related Art

As the process of manufacturing integrated circuits has developed, the size of semiconductor components has been reduced to the sub-micron level to improve the performance and operation speed of the integrated circuits. However, the reduction of the size of the components has caused some reliability problems. This is particularly true for integrated circuits, in which the protection against electrostatic discharge (ESD) is seriously affected. Generally, an electrostatic discharge protection circuit and a protected circuit both are coupled to an input/output bonding pad. When an electrostatic discharge event occurs on the bonding pad, a metal-oxide-semiconductor transistor of the protected circuit is turned on early because the gate voltage of the protected circuit increases with the voltage of the bonding pad voltage due to the effect of gate coupling charges, which causes a large current to flow through the metal-oxide-semiconductor transistor. Thus, the metal-oxide-semiconductor transistor and other components in the protected circuit are damaged by the large current.

BRIEF SUMMARY OF THE INVENTION

One exemplary embodiment of the present invention provides an electrostatic discharge protection circuit. The electrostatic discharge protection circuit is coupled to a bonding pad. The electrostatic discharge protection circuit comprises a first transistor, a second transistor, a third transistor, and a discharge circuit. The first transistor has a first gate, a first drain coupled to the bonding pad, and a first source coupled to a first node. The second transistor has a second gate coupled to a power terminal, a second drain coupled to the first gate, and a second source coupled to a ground. The third transistor has a third gate coupled to the power terminal, a third drain coupled to the first node, and a third source coupled to the ground. The discharge circuit is coupled between the bonding pad and the ground and controlled by a driving voltage at the first node. In response to an electrostatic discharge event occurring on the bonding pad, the discharge circuit provides a discharge path between the bonding pad and the ground according to the driving voltage.

Another exemplary embodiment of the present invention provides an electronic circuit. The electronic circuit comprises a protected element, a first transistor, a second transistor, a third transistor, and a discharge circuit. The protected element is coupled between a bonding pad and a ground. The first transistor has a first gate, a first drain coupled to the bonding pad, and a first source coupled to a first node. The second transistor has a second gate coupled to a power terminal, a second drain coupled to the first gate, and a second source coupled to the ground. The third transistor has a third gate coupled to the power terminal, a third drain coupled to the first node, and a third source coupled to the ground. The discharge circuit is coupled between the bonding pad and the ground and controlled by a driving voltage at the first node. In response to an electrostatic discharge event occurring on the bonding pad, the discharge circuit provides a discharge path between the bonding pad and the ground according to the driving voltage.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated model of carrying out the invention. This description is made for the purpose of illustrating the general principles of the invention and should not be taken in a limiting sense. The scope of the invention is best determined by reference to the appended claims.

Figure 1:
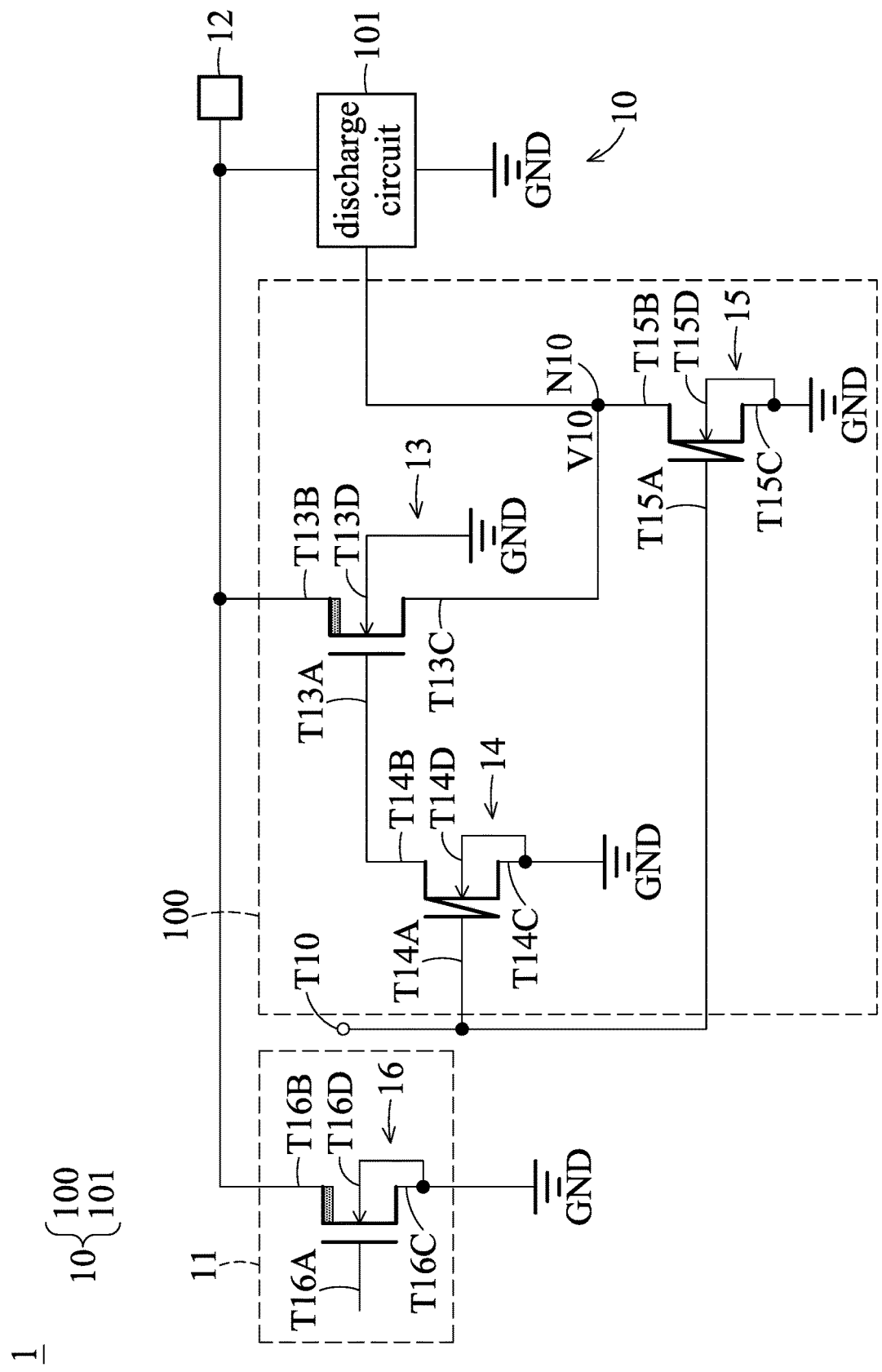
FIG. 1 shows an electronic circuit comprising an electrostatic discharge protection circuit according to an embodiment of the present invention.

FIG. 1 shows an electronic circuit comprising an electrostatic discharge protection circuit according to an embodiment of the present invention. Referring to FIG. 1, an electronic circuit 1 comprises an electrostatic discharge protection circuit 10, a protected element 11, and a bonding pad 12. When an electrostatic discharge event occurs on the bonding pad 12, the electrostatic discharge protection circuit 10 operates to provide a discharge path between the bonding pad 12 and a ground GND to protect the protected element 11 from being damaged by a large current induced by the electrostatic discharge event.

Referring to FIG. 1, the electrostatic discharge protection circuit 10 comprises a driving circuit 100 and a discharge circuit 101. The driving circuit 100 comprises metal-oxide-semiconductor (MOS) transistors 13-15, and the protected element 11 comprises at least one MOS transistor 16. In the embodiment, the conductivity types of the MOS transistors 13-16 is an N type, and each of the MOS transistors 13-16 comprises a gate, a drain, a source, and a bulk. In the description of the present application, an N-type MOS transistor is referred to as an NMOS transistor for short.

As shown in FIG. 1, the drain T16B of the NMOS transistor 16 of the protected element 11 is coupled to the bonding pad 12, and the source T16C and the bulk T16D thereof are coupled to the ground GND. The drain T13B of the NMOS transistor 13 of the driving circuit 100 is coupled to the bonding pad 12, the source T13C thereof is coupled to a node N10, and the bulk T13D thereof is coupled to the ground GND. The gate T14A of the NMOS transistor 14 of the driving circuit 100 is coupled to a power terminal T10, the drain T14B thereof is coupled to the gate T13A of the NMOS transistor 13, and the source T14C and the bulk T14D thereof are coupled to the ground GND. The gate T15A of the NMOS transistor 15 of the driving circuit 100 is coupled to the power terminal T10, the drain T15B thereof is coupled to the node N10, and the source T15C and the bulk T15D thereof are coupled to the ground GND. The discharge circuit 101 is coupled between the bonding pad 12 and the ground GND. The discharge circuit 101 is controlled by a driving voltage V10 at the node N10 to provide or not provide a discharge path between the bonding pad 12 and the ground GND.

When an electrostatic discharge event occurs on the bonding pad 12, the discharge circuit 101 provides a discharge path between the bonding pad 12 and the ground GND according to the driving voltage V10 at the node N10. In an embodiment, the discharge circuit 101 comprises a transistor. When an electrostatic discharge event occurs on the bonding pad 12, the transistor of the discharge circuit 101 is turned on through a substrate-trigged manner or a gate-triggered manner to provide a discharge path.

Figure 2:
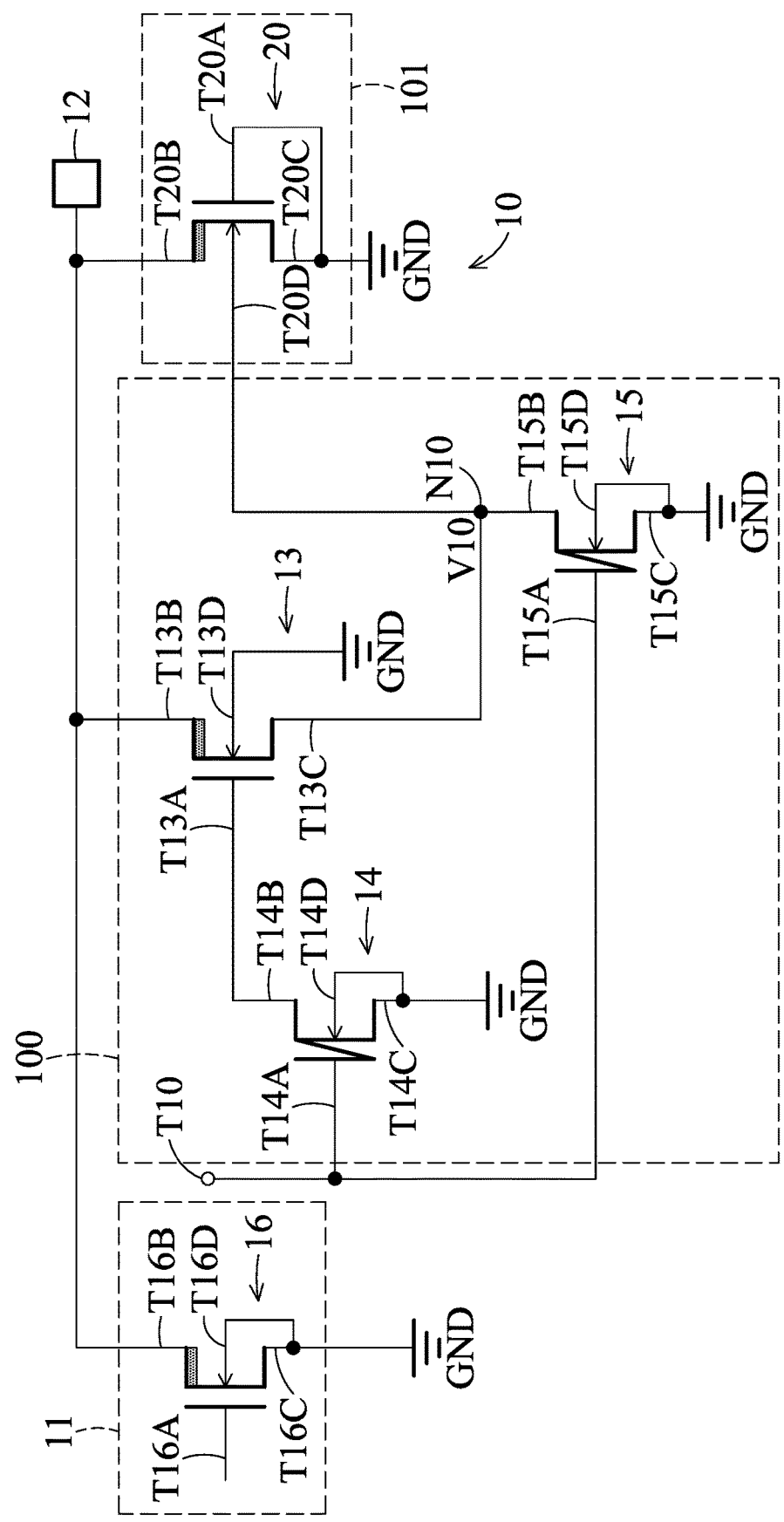
FIG. 2 is a schematic diagram showing that a discharge circuit in the electronic circuit of FIG. 1 has a first circuit structure according to an embodiment of the present invention.

FIG. 2 is a schematic diagram showing that the discharge circuit 101 in the electronic circuit 1 has a first circuit structure according to an embodiment of the present invention. In the embodiment of FIG. 2, the circuit structures of the driving circuit 100 and the protected element 11 are the same as those of the embodiment of FIG. 1, and the related description is omitted here. Referring to FIG. 2, the discharge circuit 101 comprises an NMOS transistor 20. The gate T20A of the NMOS transistor 20 is coupled to the ground GND, the drain T20B thereof is coupled to the bonding pad 12, the source T20C thereof is coupled to the ground GND, and the bulk T20D thereof is coupled to the node N10. According to the circuit structure of the discharge circuit 101, when an electrostatic discharge event occurs on the bonding pad 12, the transistor of the discharge circuit 101 is turned on through the substrate-triggered manner to provide a discharge path.

In the embodiment of FIG. 2, the detailed operation of the electrostatic discharge protection of the electronic circuit 1 will be described in the following paragraphs according to the related figures.

Figure 3A:
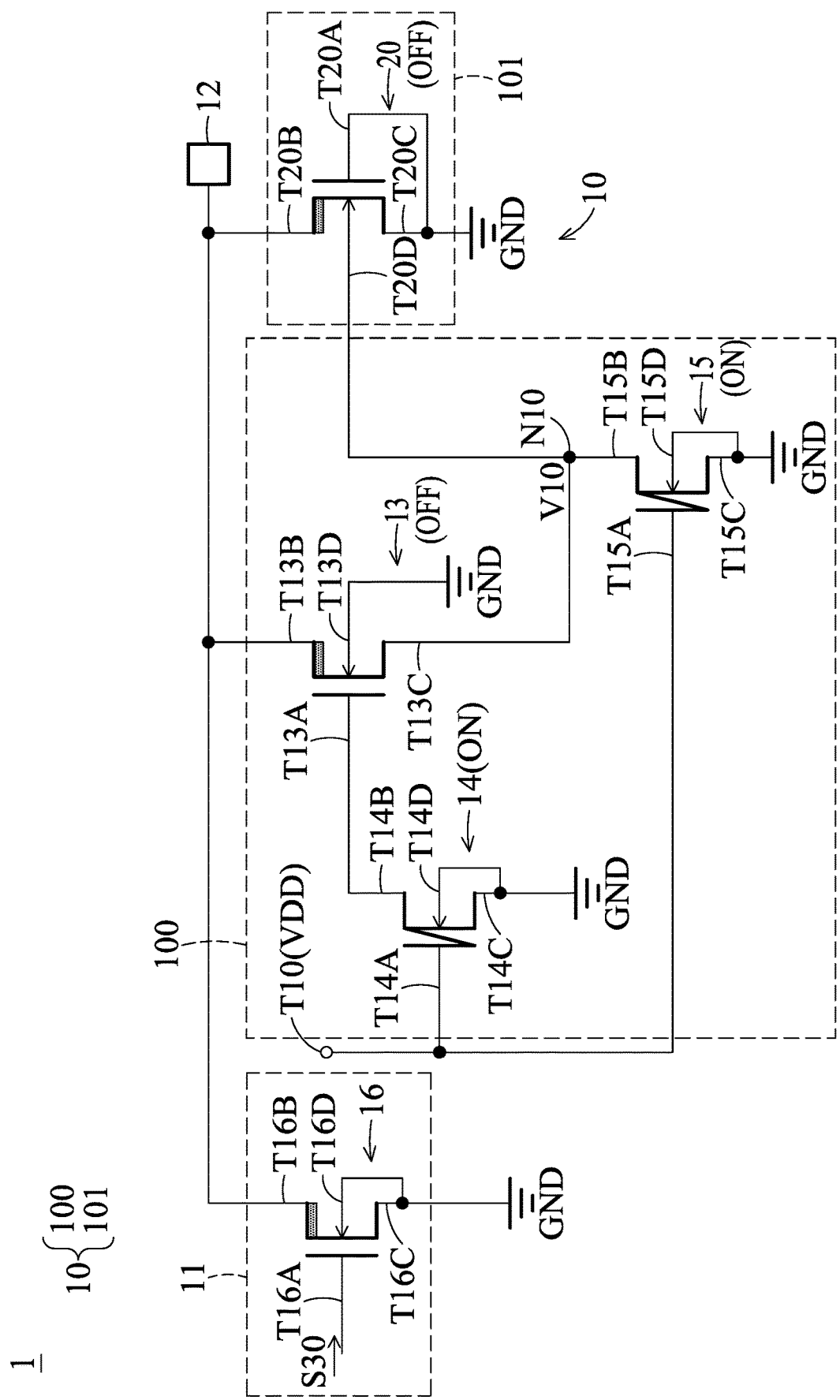
FIG. 3A is a schematic diagram showing an operation of the electronic circuit of FIG. 2 during a normal operation.

Referring to FIG. 3A, when the electronic circuit 1 operates normally, the power terminal T10 receives an operation voltage VDD, and the gate T16A of the NMOS transistor 16 receives a driving signal S30. In the embodiment, the operation voltage VDD is, for example, 5 volts (V). The driving signal S30 may be provided from a front-end device or circuit coupled to the electronic circuit 1. The NMOS transistor 16 is turned on (ON) or turned off (OFF) according to the driving signal S30. Since the respective gates T14A and T15A of the NMOS transistors 14 and 15 are both coupled to the power terminal T10, the NMOS transistors 14 and 15 are turned on (ON) according to the operation voltage VDD of 5V. The gate T13A of the NMOS transistor 13 is coupled to the ground GND through the turned-on NMOS transistor 14, and thus, the NMOS transistor 13 is turned off (OFF). Since the NMOS transistor 15 is turned on, the driving voltage V10 at the node N10 is close to or equal to the voltage level of the ground GND (for example, 0V). At this time, the voltage level of the bulk T20D of the NMOS transistor 20 is close to or equal to the voltage level of the ground GND, and the gate T20A and the source T20C are coupled to the ground GND. Thus, the NMOS transistor 20 is turned off (OFF).

Figure 3B:
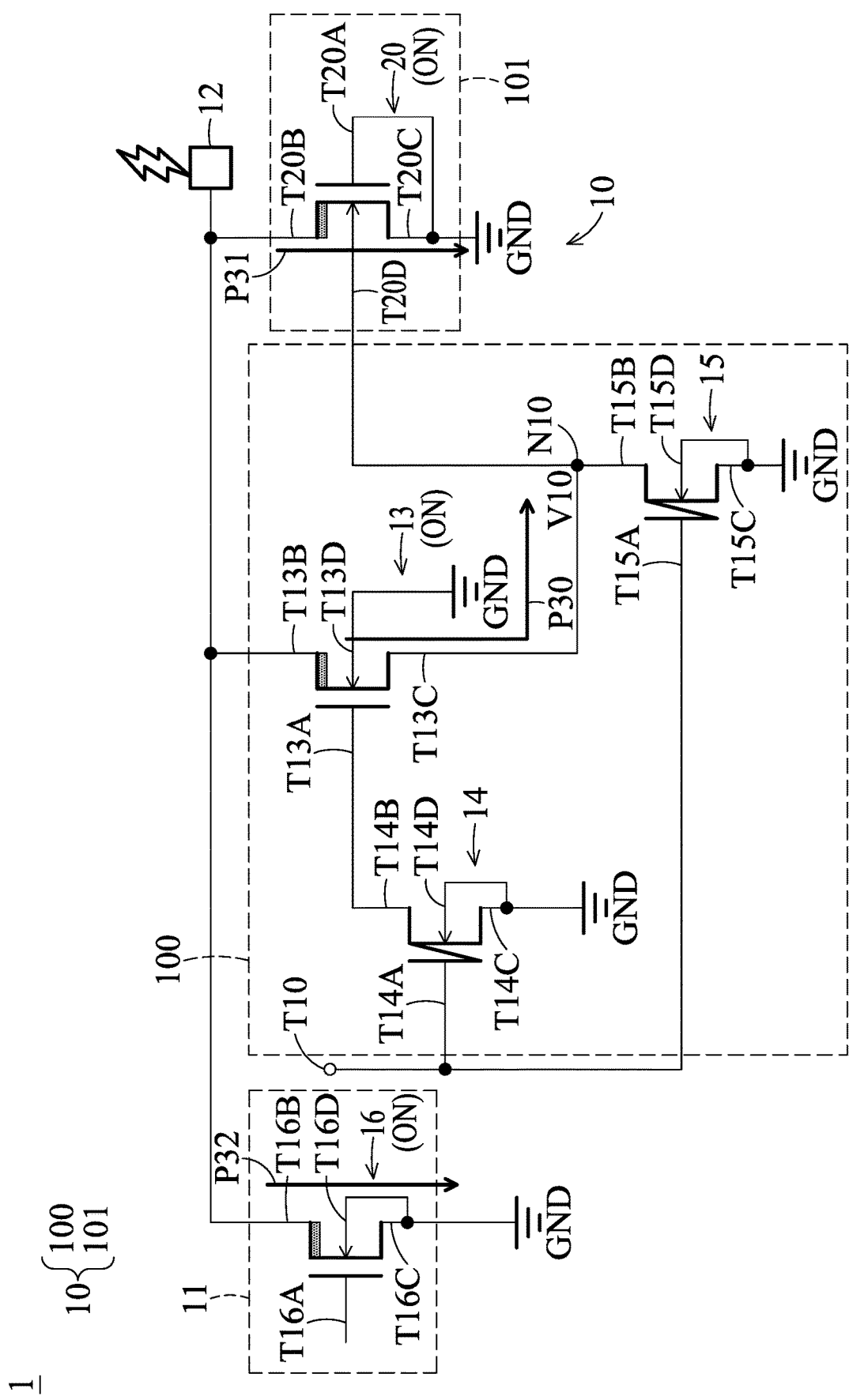
FIG. 3B is a schematic diagram showing an operation of the electronic circuit of FIG. 2 when an electrostatic discharge event occurs on the electronic circuit.

According to the above description, when the electronic circuit 1 operates normally (no electrostatic discharge event occurs), the NMOS transistor 20 is turned off according to the driving voltage V10 at the node N10. Accordingly, the discharge circuit 101 does not provide any discharge path between the bonding pad 12 and the ground GND, so that the electronic circuit 1 can operate according to the driving signal S30. Referring to FIG. 3B, when the electronic circuit 1 is not in an operation mode, the operation voltage VDD is not provided to the power terminal T10, and the gate T16A of the NMOS transistor 16 does not receive any driving signal or is at a voltage level of 0V. At this time, the power terminal T10 and the gate T16A of the NMOS transistor 16 are in a floating state. Since the power terminal T10 is in the floating state, the gate T14A of the NMOS transistor 14 is also in the floating state, and the voltage level of the gate T14A is unknown. In this case, the drain T14B of the NMOS transistor 14 is also in the floating state, that is, the gate T13A of the NMOS transistor 13 is in the floating state.

When an electrostatic discharge event occurs on the bonding pad 12 of the electronic circuit 1, the voltage level of the bonding pads 12 increases instantaneously. Due to a gate coupling effect, some charges are coupled to the gate T13A of the NMOS transistor 13 from the bonding pad 12, which makes the NMOS transistor 13 slightly turned on (ON) (that is, the NMOS transistor 13 is not fully turned on) to provide a current path P30. Since the NMOS transistor 13 is in the turned-on state, the driving voltage V10 at the node N10 increases instantaneously with the change in the voltage level of the bonding pad 12 (or the driving voltage V10 at the node N10 is equal to the voltage level of the bonding pad 12). At this time, the bulk T20D and the drain T20B of the NMOS transistor 20 have high voltage levels, and the gate T20A and the source T20C are coupled to the ground GND. Thus, the NMOS transistor 20 is turned on, which achieves the substrate triggering. The turned-on NMOS transistor 20 provides a discharge path P31. The electrostatic charges on the bonding pad 12 are conducted to the ground GND through the NMOS transistor 20 and along the discharge path P31.

As described above, when the electronic circuit 1 is not in the operation mode, the gate T16A of the NMOS transistor 16 is in the floating state. When an electrostatic discharge event occurs on the bonding pad 12, due to the gate coupling effect, some charges are coupled to the gate T16A of the NMOS transistor 16 from the bonding pad 12, which makes the NMOS transistor 16 slightly turned on (ON) (that is, the NMOS transistor 16 is not fully turned on) to provide a current path P32. In the embodiment, compared with the equivalent on-resistance of the slightly turned-on NMOS transistor 16, the turned-on NMOS transistor 20 has a smaller equivalent on-resistance. Based on the current divider rule, most of the electrostatic charges from the bonding pad 12 are conducted to the ground GND through the discharge path P31, and only a few of the electrostatic charges are conducted to the ground GND through the discharge path P32. Therefore, when an electrostatic discharge event occurs on the bonding pad 12, even though the NMOS transistor 16 is turned on due to the gate coupling effect, the current flowing through the NMOS transistor 16 is small and will not cause the NMOS transistor 16 to be damaged.

According to the embodiment shown in FIG. 2 and FIGS. 3A and 3B, when the electronic circuit 1 operates normally, the electrostatic discharge protection circuit 10 provided by the present application can keep the NMOS transistor 20 of the discharge circuit 101 turned off by providing the driving voltage V10, so that the electronic circuit 1 can operate according to the driving signal S30. In cases where the electronic circuit 1 is not in the operation mode, when an electrostatic discharge event occurs on the bonding pad 12, the electrostatic discharge protection circuit 10 turns on the NMOS transistor 20 by the driving voltage V10 in the substrate triggering manner to provide the discharge path P31. Even though the NMOS transistor 16 of the protected element 11 is turned on based on the gate coupling effect, since most of the electrostatic charges are conducted to the ground GND through the discharge path P31, few electrostatic charges (that is, a small amount of current) flowing through the NMOS transistor 16 will not damage the NMOS transistor 16.

Figure 4:
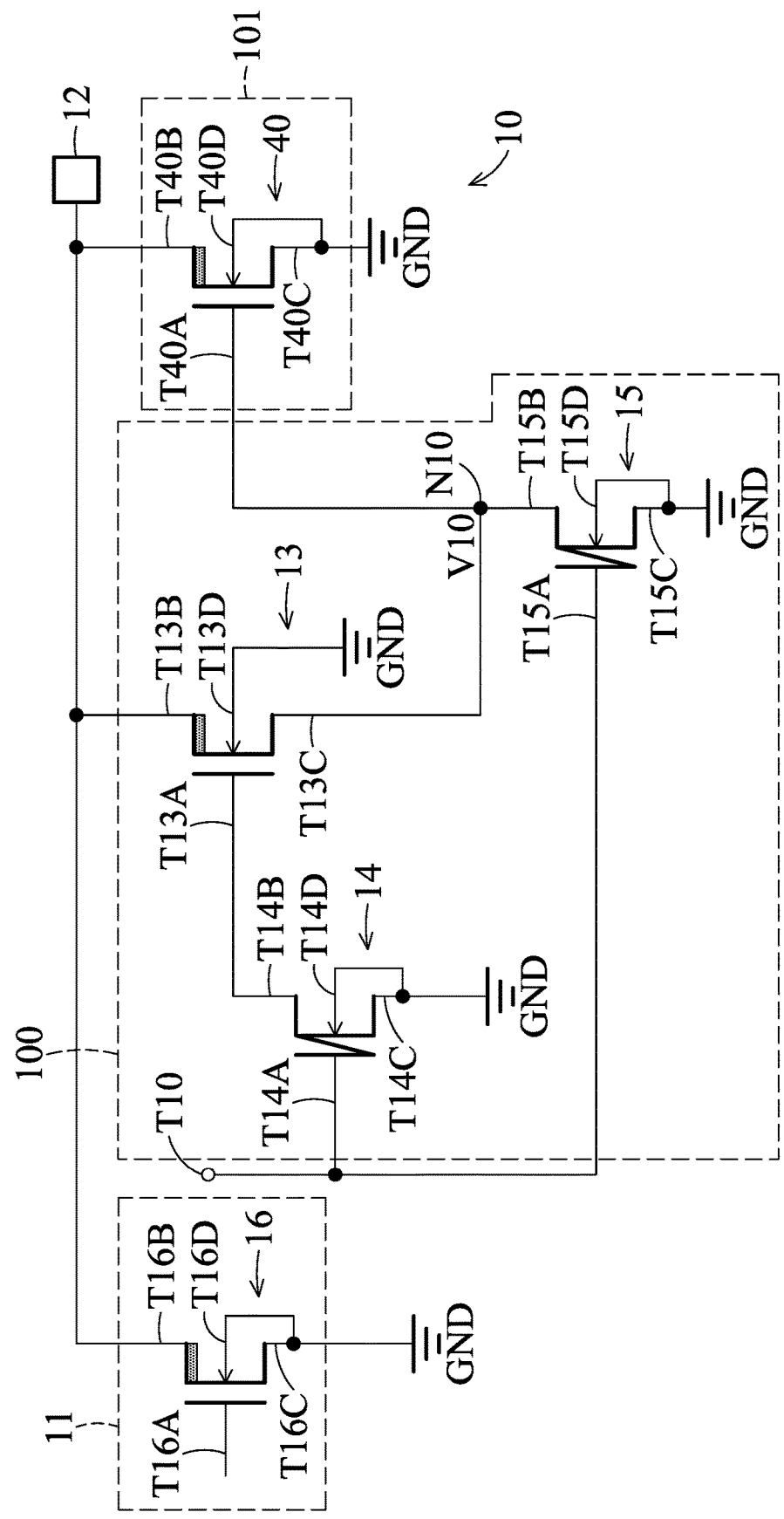
FIG. 4 is a schematic diagram showing that a discharge circuit in the electronic circuit of FIG. 1 has a second circuit structure according to another embodiment of the present invention.

FIG. 4 is a schematic diagram showing that the discharge circuit 101 in the electronic circuit 1 has a second circuit structure according to another embodiment of the present invention. In the embodiment of FIG. 4, the circuit structures of the driving circuit 100 and the protected element 11 are the same as those of the embodiment of FIG. 1, and the related description is omitted here. Referring to FIG. 4, the discharge circuit 101 comprises an NMOS transistor 40. The gate T40A of the NMOS transistor 40 is coupled to the node N10, the drain T40B of the NMOS transistor 40 is coupled to the bonding pad 12, and the source T40C and the base T40D of the NMOS transistor 40 are coupled to the ground GND. According to the circuit structure of the discharge circuit 101, when an electrostatic discharge event occurs on the bonding pad 12, the transistor of the discharge circuit 101 is turned on through the gate-triggered manner to provide a discharge path.

In the embodiment of FIG. 4, the detailed operation of the electrostatic discharge protection of the electronic circuit 1 will be described in the following paragraphs according to the related figures.

Figure 5A:
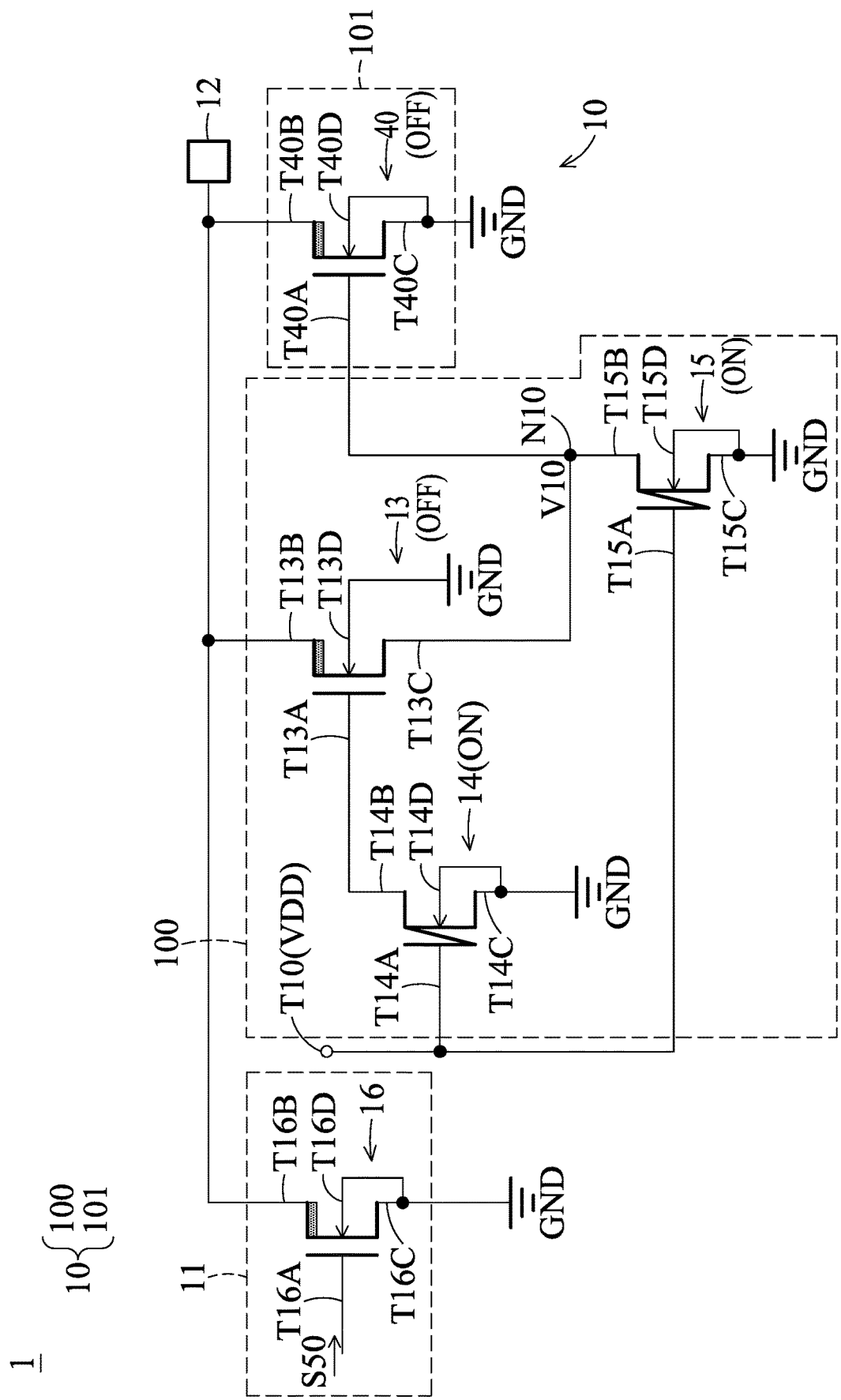
FIG. 5A is a schematic diagram showing an operation of the electronic circuit of FIG. 4 during a normal operation.

Referring to FIG. 5A, when the electronic circuit 1 operates normally, the power terminal T10 receives an operation voltage VDD, and the gate T16A of the NMOS transistor 16 receives a driving signal S50. In the embodiment, the operation voltage VDD is, for example, 5V. The driving signal S50 may be provided from a front-end device or circuit coupled to the electronic circuit 1. The NMOS transistor 16 is turned on (ON) or turned off (OFF) according to the driving signal S50. Since the respective gates T14A and T15A of the NMOS transistors 14 and 15 are both coupled to the power terminal T10, the NMOS transistors 14 and 15 are turned on (ON) according to the operation voltage VDD of 5V. The gate T13A of the NMOS transistor 13 is coupled to the ground GND through the turned-on NMOS transistor 14, and thus, the NMOS transistor 13 is turned off (OFF). Since the NMOS transistor 15 is turned on, the driving voltage V10 at the node N10 is close to or equal to the voltage level of the ground GND (for example, 0V). At this time, the voltage level of the gate T40A of the NMOS transistor 40 is close to or equal to the voltage level of the ground GND. Thus, the NMOS transistor 40 is turned off (OFF).

According to the above description, when the electronic circuit 1 operates normally (no electrostatic discharge event occurs), the NMOS transistor 40 is turned off according to the driving voltage V10 at the node N10. Accordingly, the discharge circuit 101 does not provide any discharge path between the bonding pad 12 and the ground GND, so that the electronic circuit 1 can operate according to the driving signal S50.

Figure 5B:
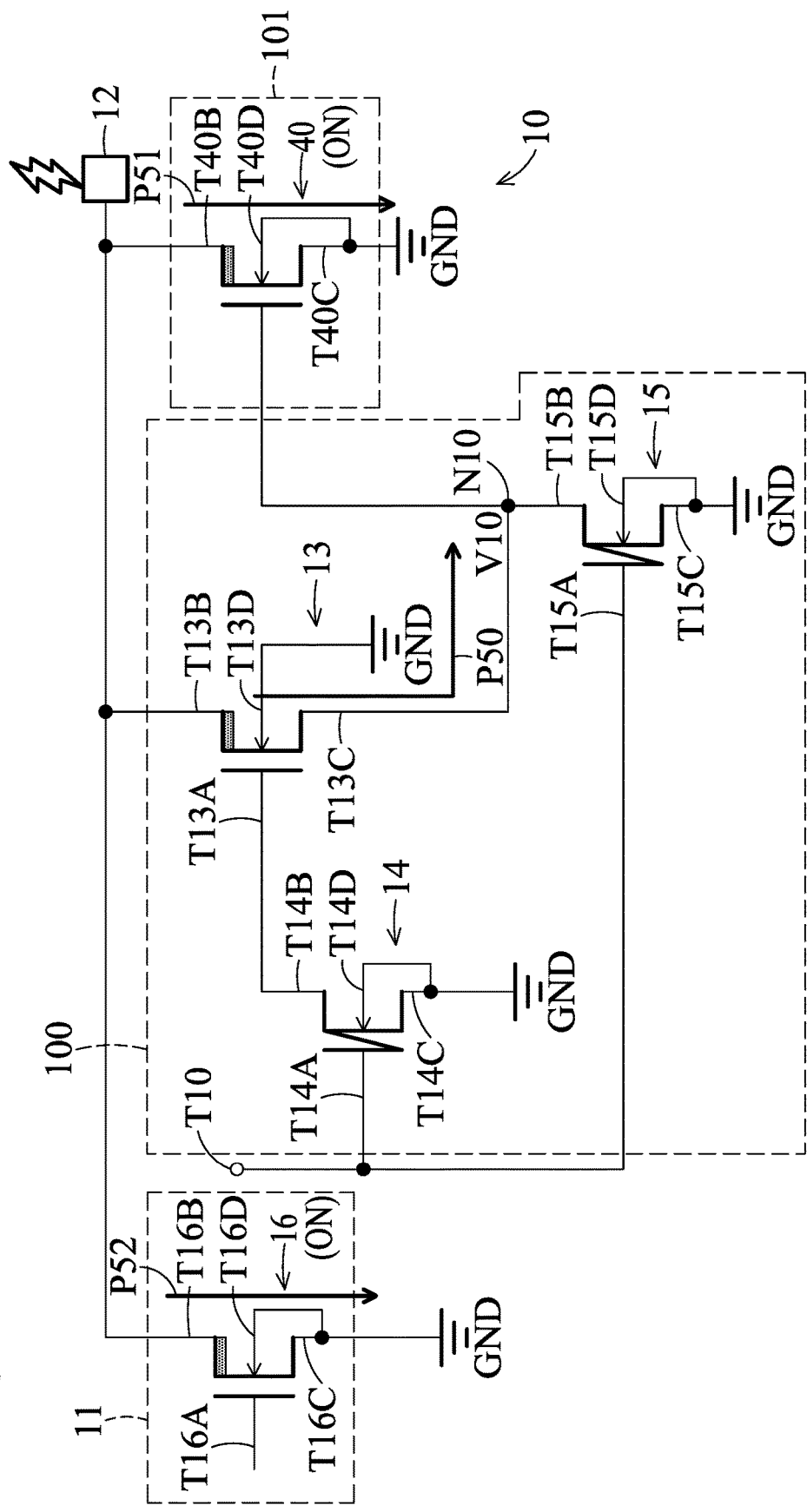
FIG. 5B is a schematic diagram showing an operation of the electronic circuit of FIG. 4 when an electrostatic discharge event occurs on the electronic circuit.

Referring to FIG. 5B, when the electronic circuit 1 is not in an operation mode, the operation voltage VDD is not provided to the power terminal T10, and the gate T16A of the NMOS transistor 16 does not receive any driving signal or is at a voltage level of 0V. At this time, the power terminal T10 and the gate T16A of the NMOS transistor 16 are in a floating state. Since the power terminal T10 is in the floating state, the gate T14A of the NMOS transistor 14 is also in the floating state, and the voltage level of the gate T14A is unknown. In this case, the drain T14B of the NMOS transistor 14 is also in the floating state, that is, the gate T13A of the NMOS transistor 13 is in the floating state.

When an electrostatic discharge event occurs on the bonding pad 12 of the electronic circuit 1, the voltage level of the bonding pads 12 increases instantaneously. Due to a gate coupling effect, some charges are coupled to the gate T13A of the NMOS transistor 13 from the bonding pad 12, which makes the NMOS transistor 13 slightly turned on (ON) (that is, the NMOS transistor 13 is not fully turned on) to provide a current path P50. Since the NMOS transistor 13 is in the turned-on state, the driving voltage V10 at the node N10 increases instantaneously with the change in the voltage level of the bonding pad 12 (or the driving voltage V10 at the node N10 is equal to the voltage level of the bonding pad 12). At this time, the gate T40A of the NMOS transistor 20 has a high voltage level. Thus, the NMOS transistor 40 is turned on, which achieves the gate triggering. The turned-on NMOS transistor 40 provides a discharge path P51. The electrostatic charges on the bonding pad 12 are conducted to the ground GND through the NMOS transistor 40 and along the discharge path P51.

As described above, when the electronic circuit 1 is not in the operation mode, the gate T16A of the NMOS transistor 16 is in the floating state. When an electrostatic discharge event occurs on the bonding pad 12, due to the gate coupling effect, some charges are coupled to the gate T16A of the NMOS transistor 16 from the bonding pad 12, which makes the NMOS transistor 16 slightly turned on (ON) (that is, the NMOS transistor 16 is not fully turned on) to provide a current path P52. In the embodiment, compared with the equivalent on-resistance of the slightly turned-on NMOS transistor 16, the turned-on NMOS transistor 40 has a smaller equivalent on-resistance. Based on the current divider rule, most of the electrostatic charges from the bonding pad 12 are conducted to the ground GND through the discharge path P62, and only a few of the electrostatic charges are conducted to the ground GND through the discharge path P52. Therefore, when an electrostatic discharge event occurs on the bonding pad 12, even though the NMOS transistor 16 is turned on due to the gate coupling effect, the current flowing through the NMOS transistor 16 is small and will not cause the NMOS transistor 16 to be damaged.

According to the embodiment shown in FIG. 4 and FIGS. 5A and 5B, when the electronic circuit 1 operates normally, the electrostatic discharge protection circuit 10 provided by the present application can keep the NMOS transistor 40 of the discharge circuit 101 turned off by providing the driving voltage V10, so that the electronic circuit 1 can operate according to the driving signal S40. In cases where the electronic circuit 1 is not in the operation mode, when an electrostatic discharge event occurs on the bonding pad 12, the electrostatic discharge protection circuit 10 turns on the NMOS transistor 40 by the driving voltage V10 in the gate triggering manner to provide the discharge path P52. Even though the NMOS transistor 16 of the protected element 11 is turned on based on the gate coupling effect, since most of the electrostatic charges are conducted to the ground GND through the discharge path P51, few electrostatic charges (that is, a small amount of current) flowing through the NMOS transistor 16 will not damage the NMOS transistor 16.

In the above embodiments, the NMOS transistors 13 and 16 and the NMOS transistors 20 and 40 in the discharge circuit 101 are high-voltage components, however, the present application is not limited thereto. For example, the NMOS transistors 13 and 16 and the NMOS transistors 20 and 40 are implemented by high voltage tolerant laterally-diffused metal-oxide semiconductor (LDMOS) transistors.

Figure 6:
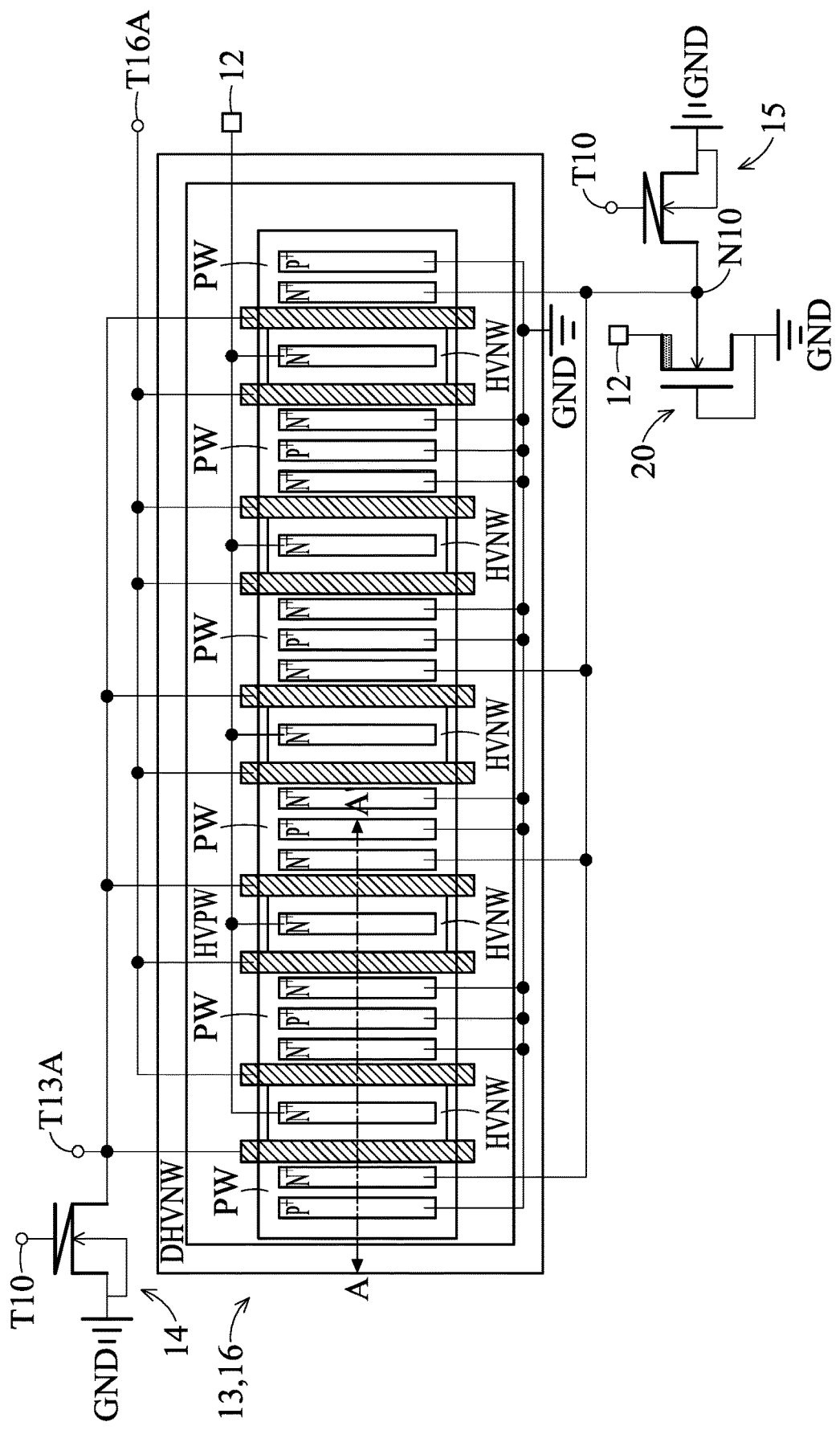
FIG. 6 is a top view showing structures of a protected element and an NMOS transistor coupled to a bonding pad in the electrostatic discharge protection circuit in FIG. 1 according to an embodiment of the present invention.

FIG. 6 is a top view showing the structures of the NMOS transistors 13 and 16 according to an embodiment of the present invention. In order to clearly show the connection relationship between the NMOS transistors 13 and 16 and other components in the electronic circuit 1, FIG. 6 also shows the bonding pad 12, the power terminal T10, the ground GND, and the NMOS transistors 14, 15, and 20, and further shows the associated connection wires. Referring to FIG. 6, the NMOS transistors 13 and 16 are formed in a common doped region on a P-type substrate 60 (shown in FIG. 7) based on a multi-finger structure and surrounded by a deep high-voltage N-type well region DHVNW. In the multi-finger structure, a plurality of finger-shaped N-type doped regions (N+) are formed in a plurality of P-type well regions PW. Among these finger-shaped N-type doped regions in the P-type well regions PW, some of the finger-shaped N-type doped regions serve as the source region of the NMOS transistor 13, and the others serve as the source region of the NMOS transistor 16. According to an embodiment, among the P-type well regions PW, the number of finger-shaped N-type doped regions serving as the source region of the NMOS transistor 16 is greater than the number of finger-shaped N-type doped regions serving as the source region of the NMOS transistor 13. For example, there are ten (10) finger-shaped N-type doped regions in the P-type well regions PW. Among these ten finger-shaped N-type doped regions, six (6) finger-shaped N-type doped regions serve as the source regions of the NMOS transistor 16, and four (4) finger-shaped N-type doped regions serve as the source regions of the NMOS transistor 13, however, the present application is not limited thereto.

Figure 7:
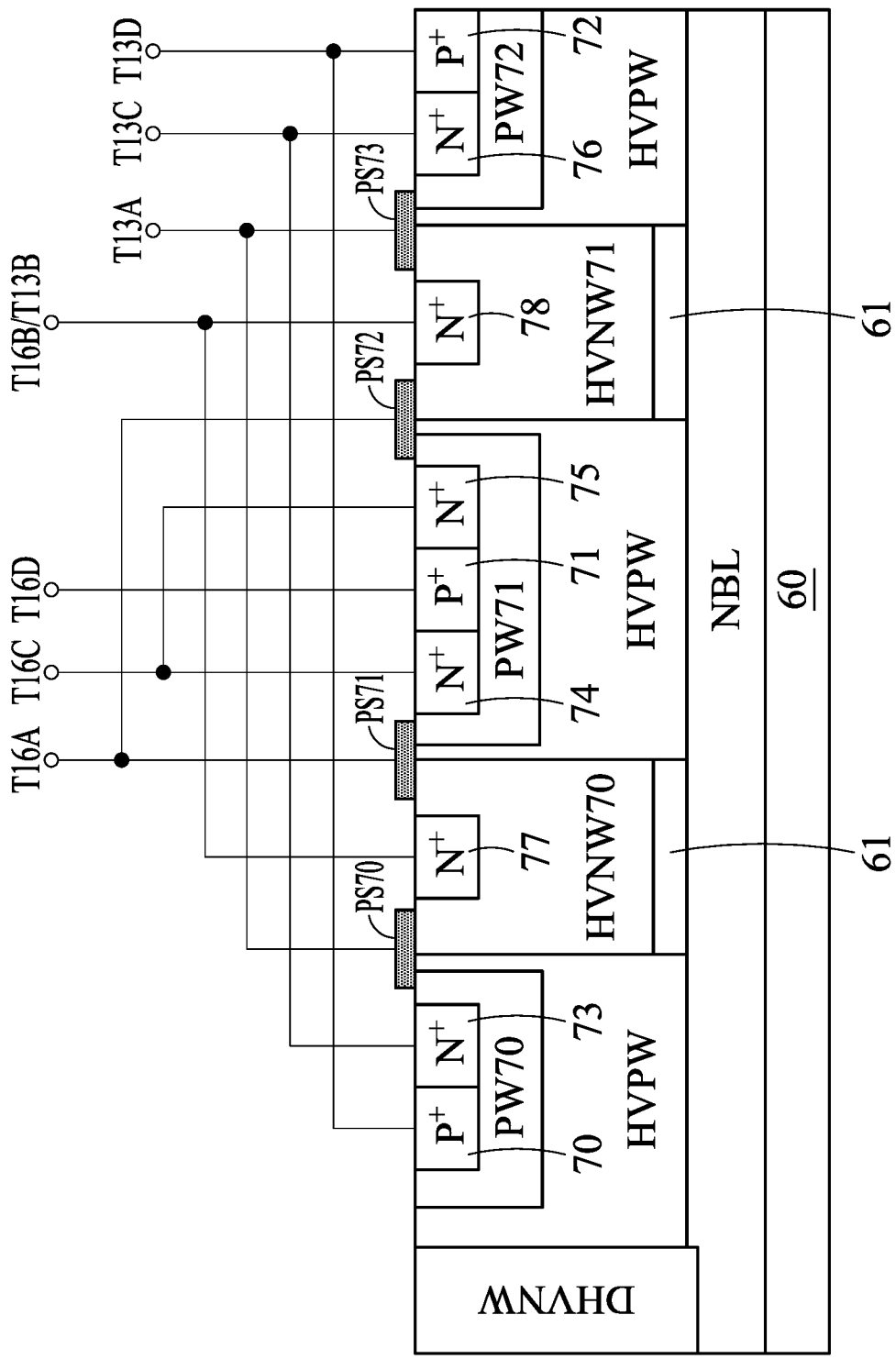
FIG. 7 is a cross-sectional view taken along a line A-N in FIG. 6 according to an embodiment of the present invention.

FIG. 7 is a cross-sectional view taken along the line A-A' in FIG. 6. Referring to FIG. 7, an N-type buried layer NBL, a deep high-voltage N-type well region DHVNW, and a P-type doped region 61 are formed on the P-type substrate 60. In the embodiment, the P-type doped region 61 serves as the aforementioned common doped region where the NMOS transistors 13 and 16 are formed.

A high-voltage P-type well region HVPW and a plurality of high-voltage N-type well regions HVNW are formed in the P-type doped region (common doped region) 61. A plurality of P-type well regions PW are formed in the high-voltage P-type well region HVPW. In the cross-sectional view in FIG. 7, two high-voltage N-type well regions HVNW70 and HVNW71 and three P-type well regions PW70-PW72 are shown. The P-type doped regions (P+) 70-72 are respectively formed in the P-type well regions PW70-PW72. An N-type doped region (N+) 73 is formed in the P-type well region PW70. N-type doped regions 74 and 75 are formed in the P-type well region PW71 and are respectively disposed on two sides of the P-type doped region 71. An N-type doped region 76 is formed in the P-type well region PW72. An N-type doped region 77 is formed in the high-voltage N-type well region HVNW70. An N-type doped region 78 is formed in the high-voltage N-type well region HVNW71.

Referring to FIG. 6, a plurality of polysilicon layers PS are formed on the high-voltage P-type well region HVPW, the high-voltage N-type well regions HVNW, and the P-type well regions PW. Referring to FIG. 7, four polysilicon layers PS70~PS73 are shown in the cross-sectional view along the line A-A'. The polysilicon layer PS70 is formed on the high-voltage P-type well region HVPW, the high-voltage N-type well region HVNW70, and the P-type well region PW70 and between the N-type doped regions 73 and 77. The polysilicon layer PS71 is formed on the high-voltage P-type well region HVPW, the high-voltage N-type well region HVNW70, and the P-type well region PW71 and between the N-type doped regions 74 and 77. The polysilicon layer PS72 is formed on the high-voltage P-type well region HVPW, the high-voltage N-type well region HVNW71, and the P-type well region PW71 and between the N-type doped regions 75 and 78. The polysilicon layer PS73 is formed on the high-voltage P-type well region HVPW, the high-voltage N-type well region HVNW71, and the P-type well region PW72 and between the N-type doped regions 76 and 78.

Referring to FIG. 7, for the NMOS transistor 13, the contact electrode electrically connected to the polysilicon layers PS70 and PS73 serves as the gate T13A, and the contact electrode electrically connected to the N-type doped regions 73 and 76 serves as the source T13C, and the contact electrode electrically connected to the P-type doped regions 70 and 72 serves as the bulk T13D. For the NMOS transistor 16, the contact electrode electrically connected to the polysilicon layers PS71 and PS72N serves as the gate T16A, the contact electrode electrically connected to the N-type doped regions 74 and 75 serves as the source T16C, and the contact electrode electrically connected to the P-type doped region 71 serves as the bulk T16D. The contact electrode electrically connected to the N-type doped regions 77 and 78 serve as the drain T13B of the NMOS transistor 13 and also serve as the drain T16B of the NMOS transistor 16. Referring to FIGS. 1, 2, 3A, 3B, 4, 5A, and 5B, the drain T13B of the NMOS transistor 13 and the drain T16B of the NMOS transistor 16 are coupled together and further coupled to the bonding pad 12.

The cross-sectional view of the semiconductor structure of the NMOS transistors 13 and 16 shown in FIG. 7 is only an example, and the present application is not limited thereto.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electrostatic discharge protection circuit, coupled to a bonding pad, for protecting a protected element, comprising:
   a first transistor having a first gate, a first drain coupled to the bonding pad, and a first source coupled to a first node;
   a second transistor having a second gate coupled to a power terminal, a second drain coupled to the first gate, and a second source coupled to a ground;
   a third transistor having a third gate coupled to the power terminal, a third drain coupled to the first node, and a third source coupled to the ground; and
   a discharge circuit coupled between the bonding pad and the ground and controlled by a driving voltage at the first node,
   wherein in response to an electrostatic discharge event occurring on the bonding pad, the discharge circuit provides a discharge path between the bonding pad and the ground according to the driving voltage.

2. The electrostatic discharge protection circuit as claimed in claim 1, wherein the discharge circuit comprises:
   a fourth transistor having a fourth gate and fourth source that are coupled to the ground, a fourth drain coupled to the bonding pad, and a first bulk coupled to the first node.

3. The electrostatic discharge protection circuit as claimed in claim 2, wherein in response to the electrostatic discharge event occurring on the bonding pad, the fourth transistor is turned on according to the driving voltage to provide the discharge path.

4. The electrostatic discharge protection circuit as claimed in claim 2, wherein in response the power terminal receiving an operation voltage, the fourth transistor is turned off according to the driving voltage.

5. The electrostatic discharge protection circuit as claimed in claim 2, wherein the first transistor and the fourth transistor are laterally-diffused metal-oxide semiconductor (LDMOS) transistors.

6. The electrostatic discharge protection circuit as claimed in claim 1, wherein the discharge circuit comprises:
   a fourth transistor having a fourth gate coupled to the first node, a fourth drain coupled to the bonding pad, and a fourth source coupled to the ground.

7. The electrostatic discharge protection circuit as claimed in claim 6, wherein in response to the electrostatic discharge event occurring on the bonding pad, the fourth transistor is turned on according to the driving voltage to provide the discharge path.

8. The electrostatic discharge protection circuit as claimed in claim 6, wherein in response the power terminal receiving an operation voltage, the fourth transistor is turned off according to the driving voltage.

9. The electrostatic discharge protection circuit as claimed in claim 6, wherein the first transistor and the fourth transistor are laterally-diffused metal-oxide semiconductor (LDMOS) transistors.

10. The electrostatic discharge protection circuit as claimed in claim 1, wherein the first transistor further has a first bulk, the second transistor further has a second bulk, and the third transistor further has a third bulk, and wherein the first bulk, the second bulk, and the third bulk are coupled to the ground.

11. The electrostatic discharge protection circuit as claimed in claim 1, wherein the first transistor and the third transistor are N-type transistors.

12. The electrostatic discharge protection circuit as claimed in claim 1, wherein the protected element is coupled to the bonding pad and comprises a fourth transistor, and the first transistor and the fourth transistor are formed in a common doped region on a substrate.

13. The electrostatic discharge protection circuit as claimed in claim 12, wherein the first transistor and the fourth transistor are laterally-diffused metal-oxide semiconductor (LDMOS) transistors.

14. The electrostatic discharge protection circuit as claimed in claim 12, wherein the first transistor and the fourth transistor are formed in the common doped region based on a multi-finger structure.

15. The electrostatic discharge protection circuit as claimed in claim 14, wherein:
   the common doped region has a first conductivity type, and a first well region with the first conductivity type is formed in the common doped region,
   the multi-finger structure comprises a plurality of finger-shaped doped regions in the first well region, and
   among the plurality of finger-shaped doped regions, the number of finger-shaped doped regions used to form the fourth transistor is greater than the number of finger-shaped doped regions used to form the first transistor.

16. An electronic circuit comprising:
   a protected element coupled between a bonding pad and a ground;
   a first transistor having a first gate, a first drain coupled to the bonding pad, and a first source coupled to a first node;
   a second transistor having a second gate coupled to a power terminal, a second drain coupled to the first gate, and a second source coupled to the ground;
   a third transistor having a third gate coupled to the power terminal, a third drain coupled to the first node, and a third source coupled to the ground; and
   a discharge circuit coupled between the bonding pad and the ground and controlled by a driving voltage at the first node,
   wherein in response to an electrostatic discharge event occurring on the bonding pad, the discharge circuit provides a discharge path between the bonding pad and the ground according to the driving voltage.

17. The electronic circuit as claimed in claim 16, wherein the first transistor and the protected element are formed in a common doped region on a substrate.

18. The electronic circuit as claimed in claim 16, wherein the discharge circuit comprises:
   a fourth transistor having a fourth gate and fourth source that are coupled to the ground, a fourth drain coupled to the bonding pad, and a first bulk coupled to the first node.

19. The electronic circuit as claimed in claim 16, wherein the discharge circuit comprises:
   a fourth transistor having a fourth gate coupled to the first node, a fourth drain coupled to the bonding pad, and a fourth source coupled to the ground.

20. The electronic circuit as claimed in claim 16, wherein the protected element comprises:
   a fourth transistor having a fourth gate, a fourth drain coupled to the bonding pad, and a fourth source coupled to the ground,
   wherein the first transistor and the fourth transistor are formed in the common doped region based on a multi-finger structure.

* * * * *